United States Patent [19]

Tokumaru et al.

[11] Patent Number: 5,523,166
[45] Date of Patent: Jun. 4, 1996

[54] PROCESS FOR FORMING THIN FILM HAVING EXCELLENT INSULATING PROPERTY AND METALLIC SUBSTRATE COATED WITH INSULATING MATERIAL FORMED BY SAID PROCESS

[75] Inventors: Shinji Tokumaru; Misao Hashimoto, both of Kawasaki; Tomomi Murata, Tokyo, all of Japan

[73] Assignee: Nippon Steel Corporation, Tokyo, Japan

[21] Appl. No.: 375,195

[22] Filed: Jan. 18, 1995

Related U.S. Application Data

[63] Continuation of Ser. No. 96,748, Jul. 23, 1993, abandoned, which is a continuation of Ser. No. 706,652, May 29, 1991, abandoned.

[30] Foreign Application Priority Data

| May 30, 1990 | [JP] | Japan | 2-138394 |
| May 30, 1990 | [JP] | Japan | 2-138395 |
| May 30, 1990 | [JP] | Japan | 2-138396 |

[51] Int. Cl.⁶ ........................................ B32B 9/00
[52] U.S. Cl. .................. 428/469; 428/472; 428/697; 428/701; 428/702
[58] Field of Search .................... 428/457, 469, 428/432, 697, 701, 702, 472, 472.2

[56] References Cited

U.S. PATENT DOCUMENTS

| 3,721,534 | 3/1973 | Kubick | 428/469 |
| 4,038,167 | 7/1977 | Young | 204/192 |
| 4,518,467 | 5/1985 | Mason | 428/469 |
| 4,595,609 | 6/1986 | Wellinghoff | 428/469 |
| 4,780,372 | 10/1988 | Tracy | 428/469 |
| 4,906,524 | 3/1990 | Takao | 428/469 |

OTHER PUBLICATIONS

*VLSI Technology*, second edition, Ed. by S. M. Sze, McGraw-Hill, 1988, pp. 258–260.
Thin Solid Films, vol. 124, pp. 55–58, 1985, "Sputter Deposition of Dielectric Films . . . ", M. N. Khan.
CIP 85, 5th Internation Colloquium On Plasmas And Sputtering, 1985, pp. 285–288, "Depot Du Quartz En Pulverisation Cathodique", D. Hinson et al.
Applied Optics, vol. 23, No. 4, pp. 552–559, 1984, "Ion Assisted Deposition Of Optical Films . . . ", J. R. McNeil et al.
IBM Tech. Disc. Bul., vol. 27, No. 10A, 1985, pp. 5649–5650, "Process For Fabrication Of Sharply Defined Multilayer Thin Film".
European Seach Report, EP 91 10 8865.

*Primary Examiner*—Ellis P. Robinson
*Assistant Examiner*—Timothy M. Speer
*Attorney, Agent, or Firm*—Kenyon & Kenyon

[57] ABSTRACT

A dense insulating thin film having a remarkably improved insulating property can be formed by a process comprising a first step of forming a first portion of an insulating thin film on a substrate by a sputtering process without exposing the substrate to a plasma or while irradiating the substrate with low energy particles and a second step of forming a second portion of the insulating thin film on the first portion while exposing the substrate to a plasma or while irradiating the substrate with high energy particles, thereby forming said insulating thin film on the substrate. The insulating property in terms of the dielectric breakdown voltage is 100 V or more as determined in a film thickness of 1 μm or less and an area of 20 mm².

4 Claims, 7 Drawing Sheets

(1)

(2)

5,523,166

PROCESS FOR FORMING THIN FILM HAVING EXCELLENT INSULATING PROPERTY AND METALLIC SUBSTRATE COATED WITH INSULATING MATERIAL FORMED BY SAID PROCESS

This application is a continuation of application Ser. No. 08/096,748 filed Jul. 23, 1993, now abandoned, which is a continuation of application Ser. No. 07/706,652 filed on May 29, 1991, now abandoned.

BACKGROUND OF THE INVENTION

1. Field of the Invention

The present invention relates to a process for forming an insulating thin film on a substrate by sputtering, and a metallic substrate coated with an insulating thin film formed by said process.

2. Description of the Related Art

In the field of electronics, there is a strong demand for a reduction of the size, an increase of the speed, and an increase of the functions of elements and devices, and to develop an insulating metal substrate capable of meeting this demand, an insulating thin film to be formed on a metallic substrate is currently produced by the following four processes.

(1) PVD processes such as vacuum evaporation wherein a source material is heated and evaporated under a low pressure to form a thin film, and ion plating and sputtering wherein a physical action by bombardment of ions or electrons in a gaseous phase is utilized to form a thin film.

(2) A CVD process wherein various energies are applied to a gas for activation and excited species are reacted with each other to deposit a new solid species on a substrate.

(3) A process wherein the surface of a substrate is oxidized or nitrided by a gas species in a heated or plasma state.

(4) A process wherein an anodic formation is conducted in an aqueous solution.

Recently, among the above-described processes for the formation of an insulating thin film, ion plating and sputtering (particularly magnetron sputtering) have been used due to the advantage thereof of an elimination of the necessity to heat the substrate and a lower susceptibility to the inclusion of impurities. In the above-described processes, however, the substrate is bombarded by electrons, ions or high energy neutral particles, and consequent damage to a thin film in an early stage of the growth thereof causes a growth of film containing voids, so that throughholes penetrating the substrate and leading to the surface of the thin film are formed: This unfavorably causes an increase in the leak current and a lowering in the dielectric strength.

In general, if it is assumed that the defect density n causing a leak current and a breakdown of an insulating property when a voltage is applied across the electrode and the substrate, follows the Poisson distribution, then the following relationship is established:

$$Z = \exp\{-n.S\} \quad (1)$$

wherein Z is a proportion at which the insulating property is ensured (percentage insulation) and S is an electrode area. Further, the equation (1) can be rewritten as:

$$\log(Z) = -n.S \quad (2)$$

That is, as the electrode area increases, the percentage insulation is lowered exponentially. FIG. 1 shows a relationship between S (electrode area) and log (Z) (logarithm of a proportion at which the insulating property of a resistance of 20 MΩ or more is maintained at an applied voltage of 1 V where a 0.5 μm-thick $Al_2O_3$ film has been formed on a stainless steel substrate by magnetron sputtering). As apparent from the drawing, it is difficult to ensure the insulating property when the electrode area is 20 $mm^2$, and thus to fill up the pin holes, it is necessary to increase the thickness of the film (see, for example, M. N. KHAN: Thin Solid Films, 124 (1985) 55–58), i.e., the thickness must be increased to 1 μm or more in the case of the magnetron sputtering process and 2 μm or more in the case of the ion plating process.

To avoid the bombardment of the substrate by electrons, ions and high energy neutral particles during the growth of the thin film, an attempt has been made to provide an opposed target sputtering process wherein a pair of targets are provided opposite to each other, a magnetic field is applied between the targets to confine a plasma in the space, and a substrate is provided outside the plasma to form a thin film (see, for example, Japanese Unexamined Patent Publication (Kokai) No. 63-121658).

The bombardment of the substrate by the ions or high energy neutral particles, however, serves to repair the defect and increase the density of the thin film. When a thin film is formed on a metallic or other substrate having a rough surface, the existence of a portion of the substrate on which a thin film material is not deposited, due to a shadow effect, causes the defect to remain unfilled if the above-described bombardment action is not utilized, and thus a thin film having a low insulating property is unfavorably formed.

An object of the present invention is to solve the above-described problem through the use of sputtering in two different atmospheres or conditions in the formation of an insulating thin film on the surface of a substrate, and to provide a process for the formation of an insulating thin film exhibiting an excellent insulating property even when the thickness is 1 μm or less.

SUMMARY OF THE INVENTION

To attain the above-described object, the present invention provides a process for forming an insulating thin film on a substrate, comprising a first step of forming a first portion of said insulating thin film on a substrate by sputtering without exposing the substrate to a plasma or, while low energy particles are irradiated, and a second step of forming a second portion of said insulating thin film on said first portion while exposing said substrate to a plasma, or while high energy particles are irradiated, to thereby form an insulating thin film on a substrate.

According to the present invention, in the early stage of the growth of the thin film, damage to a thin film by a plasma or high energy particles is avoided to thus suppress the formation of defects, and in the latter stage of the growth, the defect is repaired and the thin film is densified by a plasma or high energy particles, to thereby enable the insulating property of the thin film to be improved. In this connection, however, it should be noted that, if the thin film is formed in a plasma-free state or without irradiation of high energy particles in both of the above-described first and second steps, defects are formed during the growth of the thin film and a repair of the defects by a plasma or high energy particles can not be made due to the absence of the plasma or high energy particles, so that a thin film having an excellent insulating property can not be prepared.

The first step may be conducted by a sputtering not involving the generation of a plasma, for example, a sputtering of a target with an ion beam, etc. In such a sputtering, low energy particles having an energy of at most 500 eV may be irradiated with to the substrate. Alternatively, the first step may be conducted by a sputtering involving the generation of a plasma, for example, a magnetron sputtering, facing targets sputtering, ECR plasma sputtering, etc., in such a manner that the substrate is not exposed to the plasma. In the sputtering involving the generation of a plasma, the exposure of the substrate to the plasma can be avoided by either the provision of the substrate outside the plasma or the confinement of the plasma in a given region through an action of a magnetic field.

In the second step of the sputtering, if not involving the generation of a plasma, high energy particles having, for example, 100 to 2000 eV may be irradiated with to the substrate, or a sputtering involving the generation of a plasma is used. Here, it should be noted that the energy of the irradiated particles in the second step must be higher than that is the first step. For example, if the former is 50 eV, the latter may be 100 eV, and if the former is 400 eV, the latter is 600 eV.

In the sputtering involving the generation of a plasma, it is possible to conduct the first and second step in the same sputtering chamber. In this case, the sputtering may be conducted in such a manner that, in the first step, the substrate is outside the plasma, and in the second step, the substrate is exposed to the plasma. Alternatively, the position of the substrate may fixed, and in the first step the plasma is confined through magnetic field action so that the plasma does not reach the substrate, and in the second step the magnetic action is removed to expose the substrate to the plasma.

Further, it is also possible to conduct the first and second steps in different chambers, whereby the substrate is successively transferred from the first sputtering chamber to the second sputtering chamber without breaking the vacuum. This enables the substrate to be transferred without exposure to the air, which prevents a contamination of the surface of the film formed in the first step with moisture, etc. and further, remarkably improves the productivity.

In the present invention, a thin film of an oxide of at least one member selected from the group considering of Ta (tantalum), Al (aluminum), Si (silicon), Ti (titanium), Ba (barium), Sr (strontium), Zr (zirconium), Y (yttrium) and Hf (hafnium), or a nitride of at least one of Al (aluminum), Si (silicon) and B (boron) can be formed as an insulating thin film. Although the thickness of the thin film deposited on the surface of the substrate by the sputtering in the first step varies depending upon the types of the substrate and the film, it should be at least 5 nm, preferably at least 10 nm, more preferably 15 nm to 150 nm, and up to 90% of the total thickness, wherein the defect formed during the growth can be repaired by the plasma in the sputtering in the second stage. When the thickness is less than 5 nm or exceeds 90% of the total thickness, a thin film having an excellent insulating property cannot be obtained.

The insulating thin film formed by the process of the present invention has an excellent insulating property because the defects are repaired and the density is high. Typically, a dielectric breakdown voltage of 100 V or more can be obtained in an area of 20 mm$^2$, and further, at an area of 100 mm$^2$ even when the film thickness is 1 µm or less, and even further 0.3 µm or less.

Therefore, according to another aspect of the present invention, there is provided a metallic substrate coated with an insulating material, which comprises a metallic substrate and an insulating thin film formed thereon. The wording "metallic substrate having an excellent insulating property in a large area" used in herein is intended to mean various insulating substrates used in the field of microelectronics, including a substrate having an electrode area of about 10 to 100 mm$^2$ used for a capacitor, etc., for example, a substrate for a solar cell. Examples of the metallic substrate include aluminum, stainless steel, etc.

DESCRIPTION OF THE PREFERRED EMBODIMENTS

The rise of the substrate temperature may be measured as an indication of the extent of the exposure of the substrate to the plasma. When a film is formed by sputtering, the temperature of the substrate rises due to the heat of condensation, the bombardment of evaporated atoms, ions, fast neutral particles and electrons, the heat of neutralization of ions and the radiation heat. Among them, the rise of the substrate temperature due to the bombardment of electrons is negligible when the substrate is earthed. The rise of the substrate temperature due to the radiation heat is also negligible if the coefficient of heat radiation of the target is small, but even if not, the heat generation can be suppressed by cooling the target with water. Therefore, the rise of the substrate temperature should be small if a film is formed such that a plasma is confined in a predetermined space or the substrate is provided apart from the plasma to inhibit the bombardment of the substrate with ion or fast neutral particle.

Figure 1:
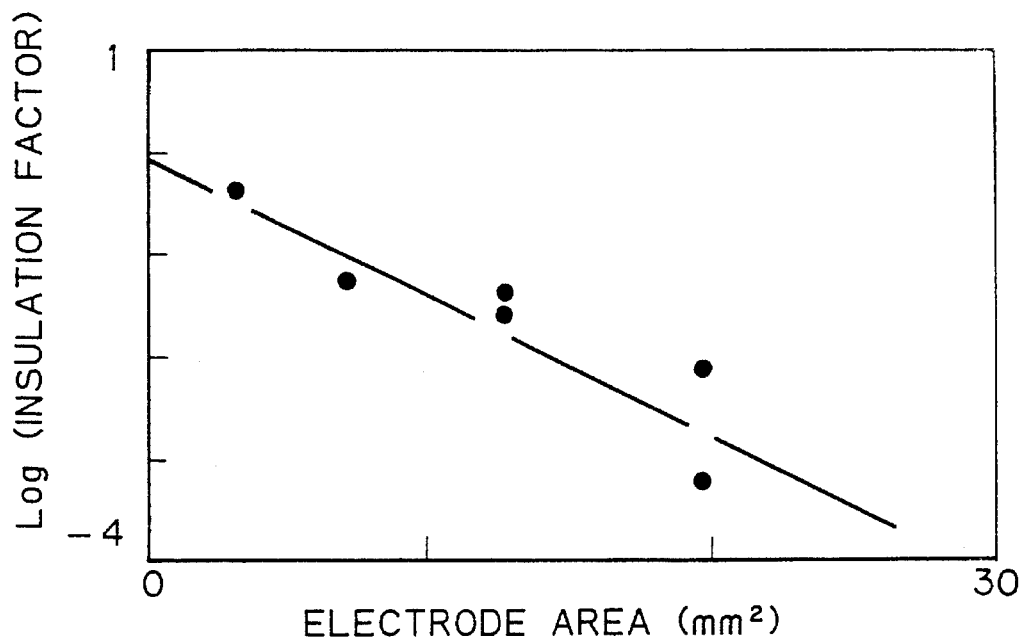
FIG. 1 is a graph showing the relationship between the percentage insulation and the electrode area.
Figure 2A:
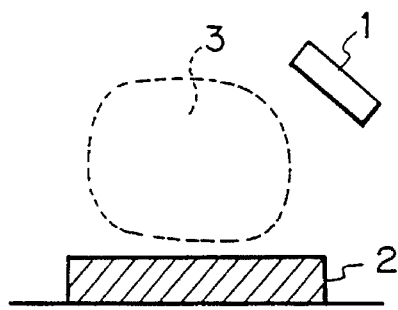
FIGS. 2A and 2B are explanatory views showing the position of a substrate in the formation of the insulating thin film according to the present invention.
Figure 2B:
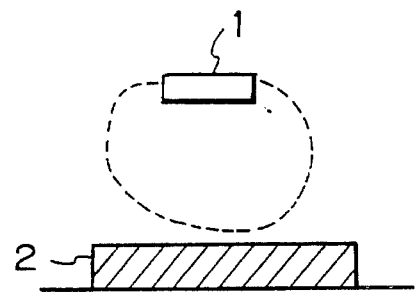

In the magnetron sputtering, the simplest method of forming a film such that the bombardment of the substrate with ion or fast neutral particles can be avoided, is to provide the substrate at the substrate position shown in FIG. 2A. The substrate position shown in FIG. 2B is a usual substrate position, and when the substrate is provided at this position, the bombardment of the substrate with negative ions cannot be avoided, which causes a rise of the temperature of the substrate. Table 1 shows the maximum rise of the temperature of the substrate at the substrate positions shown in FIGS. 2A and 2B when an $Al_2O_3$ target is sputtered under conditions of a high frequency output of 1 kW and an argon atmosphere pressure of 5 mTorr.

Figure 3:
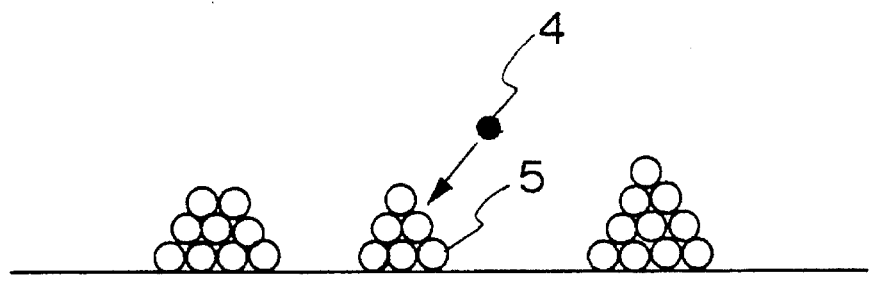
FIGS. 3 and 4 are explanatory views showing the influence of an ion on a thin film during the growth thereof, wherein (1) and (2) in FIG. 3 show the change of the thin film with time at the time of nucleation and (1) to (4) in FIG. 4 show the change of the thin film with time during the growth.
Figure 3:
Figure 3:
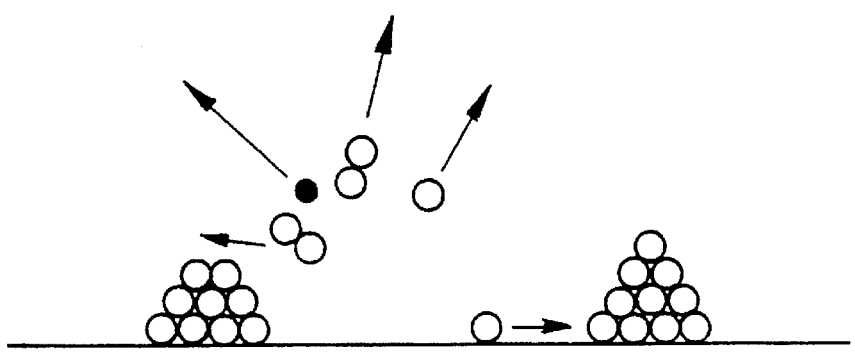
Figure 4:
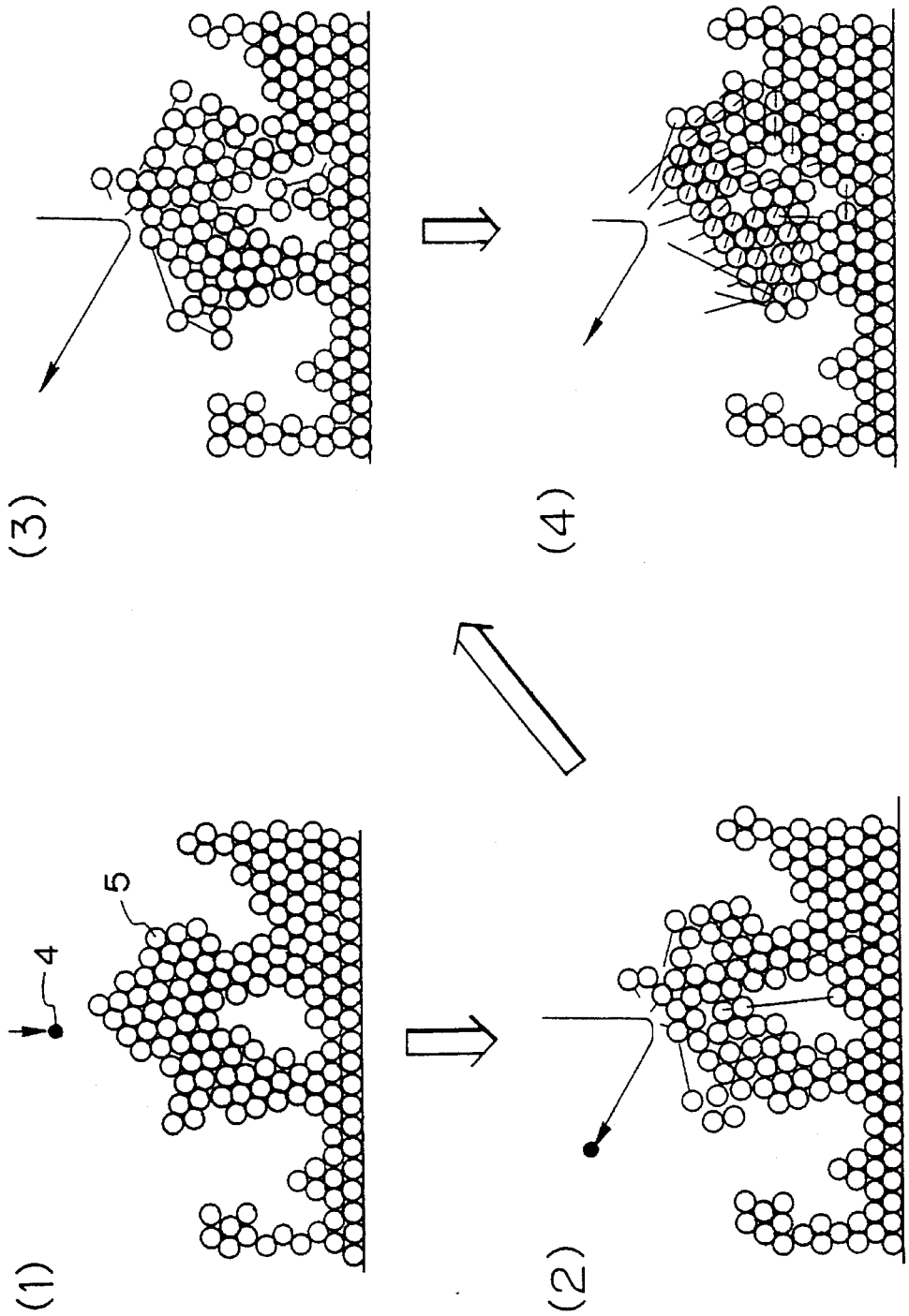

In the process for forming an insulating thin film according to the present invention, when a film is formed in the first stage at the substrate position shown in FIG. 2A, since neuclei are less susceptible to breaking by ions during nucleation (see FIG. 3), a continuous film is formed in an early stage, without defects, and the subsequent transfer of the substrate to the substrate position shown in FIG. 2B enables a dense thin film having minimal defects to be prepared due to the defect repairing action of ions during the formation of the film (see FIG. 4). In contrast, when a film is formed with the substrate fixed to the substrate position shown in FIG. 2A, no action of ions with respect to the repair of the defect formed during the growth of the film can be obtained, and thus a dense thin film cannot be prepared.

The effect exerted at the substrate position shown in FIG. 2A can be attained also when the position of the substrate is fixed to the substrate position shown in FIG. 2B, if the plasma is confined in a predetermined space so that the substrate is not exposed to the plasma.

Further, the present invention can be carried out by using a sputtering in which the energy of ions irradiated on to a substrate can be controlled, and by effecting the first step without an irradiation of ions or with an irradiation of ions having a low energy, and effecting the second step with an irradiation of ions having a high energy.

The present invention will now be described in more detail by way of the following Examples, which should not be construed as limiting the scope of the present invention.

Example 1

The process for forming an insulating thin film according to the present invention was practiced through the use of a target comprising $Al_2O_3$ and an argon gas as an atmosphere gas set at a pressure of $5\times10^{-3}$ Torr. Stainless steel (SUS430BA) having a size of 8 cm×8 cm ×0.5 mm was used as a substrate. The substrate was first provided at a substrate position shown in FIG. 2A and the formation of a film was conducted. Then the substrate was transferred to a substrate position shown in FIG. 2B, and the formation of a film was conducted. The total thickness was 500 nm, and the thickness of the film formed at the substrate position shown in FIG. 2A was varied. Further, 25 electrodes of aluminum each having a diameter of 5 mm and a thickness of 100 nm were prepared as an upper electrode by magnetron sputtering.

Figure 5:
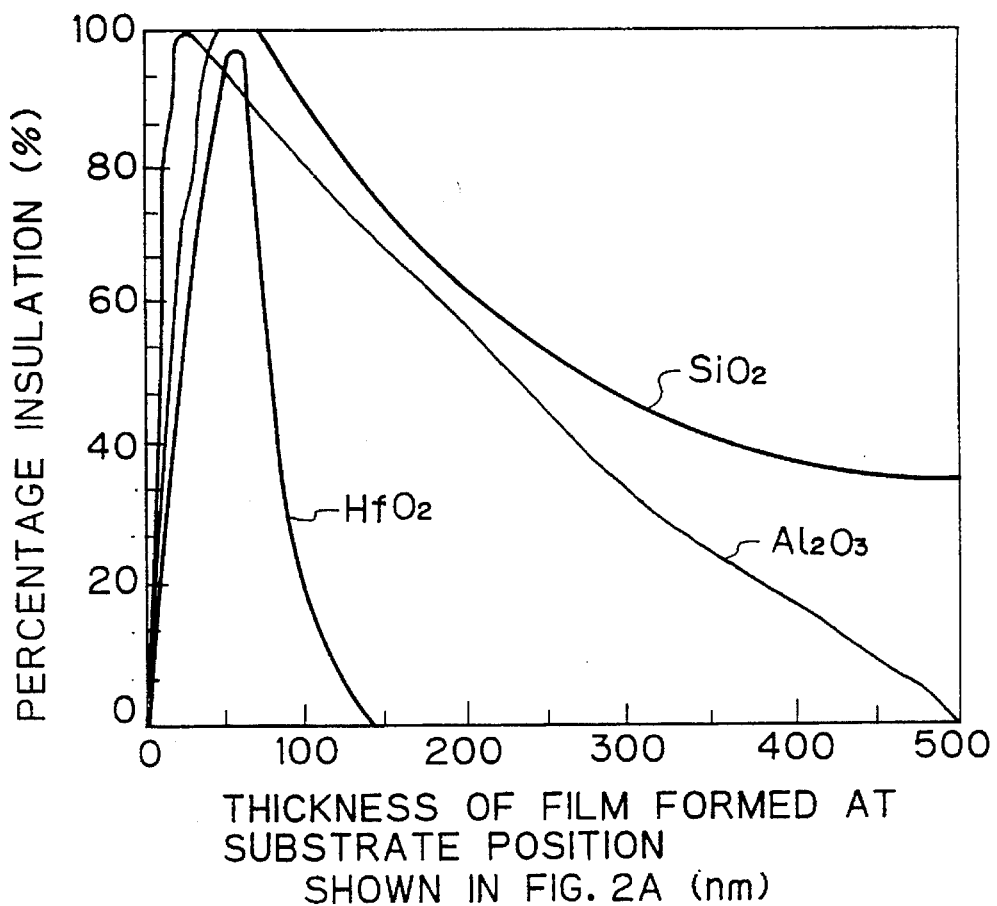
FIG. 5 is a graph showing the relationship between the proportion (percentage insulation) of the number of electrodes having a resistance of 20 MΩ or more when a voltage of 1 V is applied across the substrate and the electrode with respect to 25 samples prepared according to the present invention and the thickness of the thin film formed at the substrate position of FIG. 2A.

A voltage of 1 V was applied across the substrate and each electrode of the samples prepared above, and the proportion (percentage insulation) of the number of electrodes having a resistance of 20 MΩ or more is shown in FIG. 5. The axis of abscissa represents the thickness of a film formed at the substrate position shown in FIG. 2A.

As apparent from FIG. 4, when an insulating film is formed with the substrate fixed to only the position shown in FIG. 2A or with the substrate fixed to only the position shown in FIG. 2B, the percentage insulation is 0 (zero) % and the insulating thin film prepared according to the present invention exhibits a better insulating property. Further, it was confirmed that, to attain a percentage insulation of 80% or more, the thickness of the film formed at the substrate position shown in FIG. 2A should be 5 to 100 nm.

TABLE 1

| Substrate position | Temp. (°C.) |
| --- | --- |
| FIG. 2A | 150 |
| FIG. 2B | 320 |

Example 2

Figure 6:
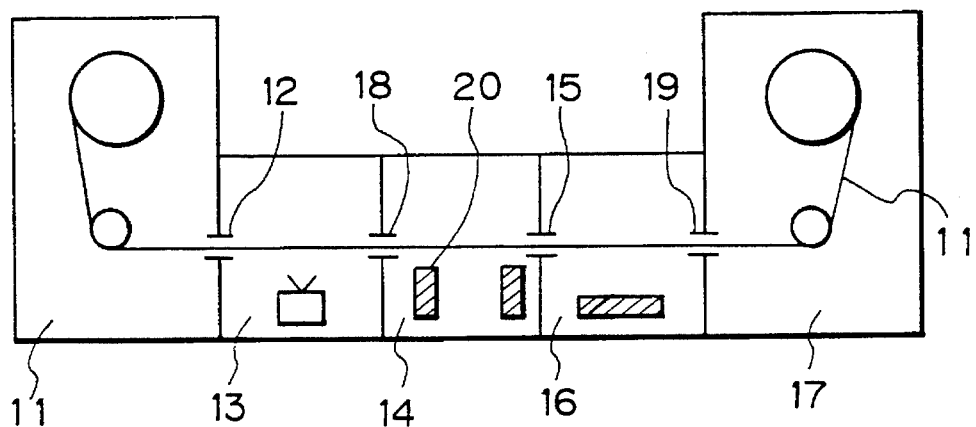
FIG. 6 is an explanatory view of an embodiment of an apparatus for practicing the present invention in a successive manner.

FIG. 6 is a schematic view of an example of an apparatus used for practicing the present invention in a successive manner.

In this apparatus, a coil (substrate) 21 transferred from an unwinding chamber 11 through a slit 12 to an ion bombardment chamber 13 is washed by an RF ion bombardment treatment and then transferred to a facing target sputtering chamber 14. In this chamber, a thin film having a thickness of from 50 nm to 90% of the total film thickness is formed. The substrate is then transferred to a magnetron sputtering chamber 16 through a slit 15. In the magnetron sputtering chamber, the same substance is deposited on the substrate. After the formation of the thin film, the coil is taken up in a winding chamber 17. Numerals 2, 5, 8, 9 denote slits, and 20 denotes a target.

As an example of the use of the above-described apparatus, the process for forming an insulating thin film according to the present invention was practiced through the use of a target comprising $Al_2O_3$ in both the above-described sputtering processes and an argon gas as an atmosphere gas at a gas pressure of $1\times10^{-3}$ Torr in the case of the facing targets sputtering process and $5\times10^{-3}$ Torr in the magnetron sputtering process.

SUS430BA was used as the substrate, the total thickness of the films formed in both the above-described sputtering processes was 500 nm, and the thickness of the film formed by the facing targets sputtering process was varied. Further, 25 electrodes of aluminum each having a diameter of 5 mm were prepared as an upper electrode by magnetron sputtering.

Figure 7:
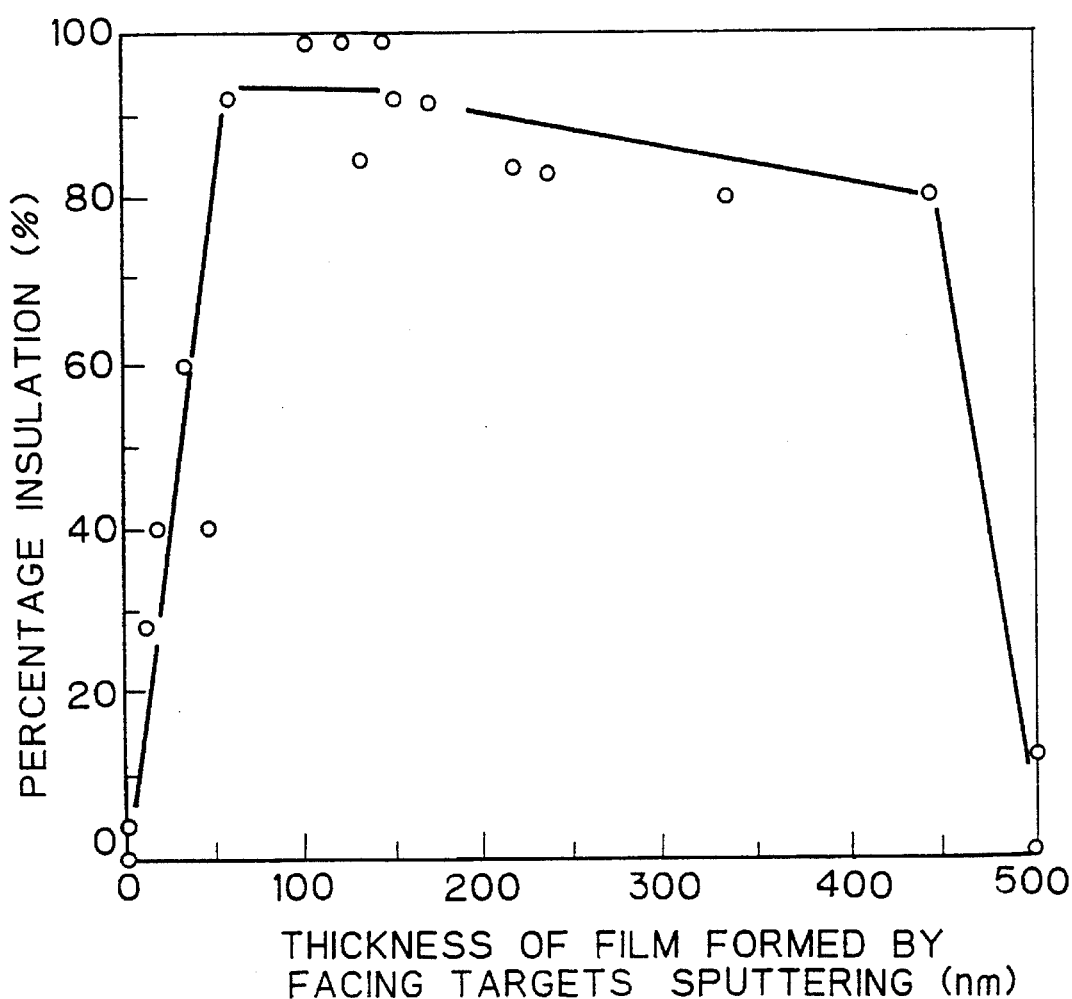
FIG. 7 is a graph showing the relationship between the proportion (percentage insulation) of the number of electrodes having a resistance of 20 MΩ or more when a voltage of 1 V is applied across the substrate and the electrode with respect to 25 samples prepared according to the present invention and the thickness of the thin film formed by the facing target sputtering process.

A voltage of 1 V was applied across the substrate and each electrode of the samples prepared above, and the proportion (percentage insulation) of the number of electrodes having a resistance of 20 MΩ or more is shown in FIG. 7. As apparent from FIG. 7, when an insulating film is formed by the facing targets sputtering process alone or the magnetron sputtering process alone, the percentage insulation was 0 (zero) % and the insulating thin film prepared according to the present invention exhibited a better insulating property. Further, it was confirmed that, in attain a percentage insulation of 80% or more, the thickness of the film formed by the opposed target sputtering process used in the first stage should be 50 to 450 nm (10 to 90% of the total film thickness).

Example 3

Figure 8:
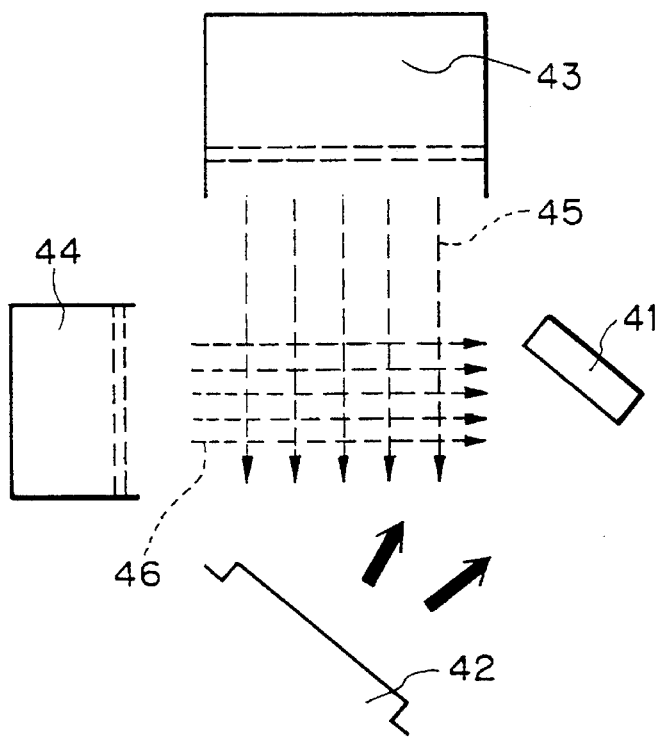
FIG. 8 is an explanatory view of an embodiment of an apparatus for practicing the present invention.

An ion beam sputtering was conducted using an apparatus shown in FIG. 8, in which 41 denotes a substrate, 42 a target, 43 an ion beam source for sputtering the target 42, 44 an ion beam source for bombardment of the substrate 41, and 45 and 46 ion beams. The target 42 of $Al_2O_3$ was sputtered by an Ar ion beam 45 under a pressure of $2\times10^{-4}$ Torr while irradiating the substrate 41 with Ar ions 46 having an energy of at most 500 eV, to deposit a first portion of an $Al_2O_3$ layer on the substrate 41, the first portion of the $Al_2O_3$ layer having a thickness of 20 nm. Subsequently, the energy of the Ar ion beam 46 was changed to 1000 eV or a magnetron sputtering was used and a second portion of the $Al_2O_3$ layer was deposited on the first portion of the $Al_2O_3$ layer. The total thickness of the $Al_2O_3$ layer was 500 nm, and 25 electrodes of aluminum each having a diameter of 5 mm and a thickness of 100 nm were deposited as an upper electrode by magnetron sputtering.

Figure 9:
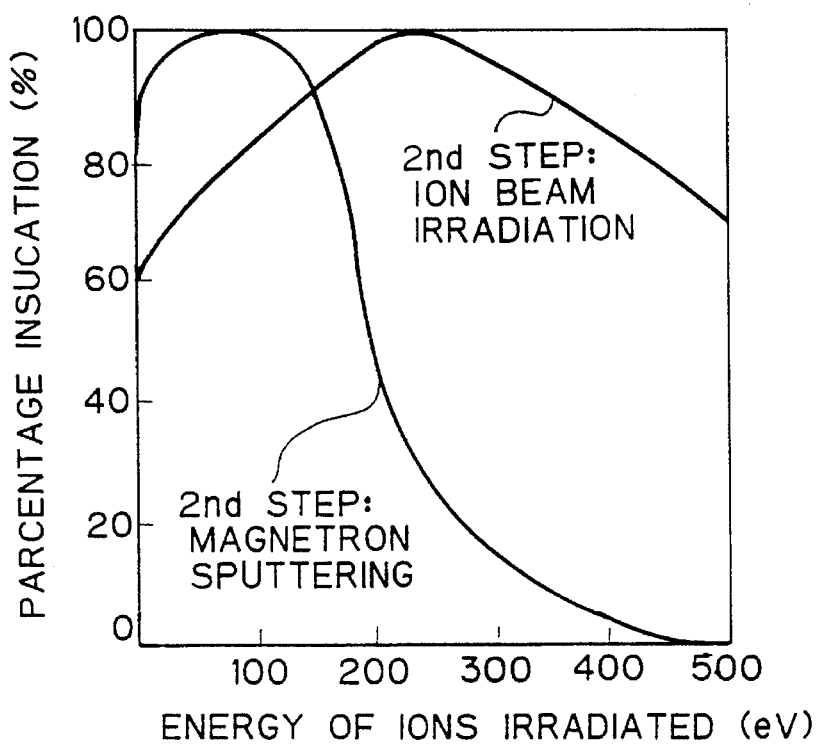
FIG. 9 is a graph showing the relationship between the proportion (percentage insulation) of the number of electrodes having a resistance of 20 MΩ or more when a voltage of 1 V is applied across the substrate and the electrode and the energy of ions irradiated.

A voltage of 1 V was applied across the substrate and each of the electrodes prepared above and the proportion (percentage insulation) of the number of electrodes having a resistance of 20 MΩ or more is shown in FIG. 9. The abscissa represents the energy of ions irradiated in the first step. As seen in FIG. 9, when an insulating film is formed while irradiating with high energy particles having an energy of more than 500 eV, the percentage insulation is 0 (zero) %, and it was confirmed that the energy of ions irradiated in the first step should be made not more than 400 eV to obtain an 80% insulation.

Example 4

Figure 10:
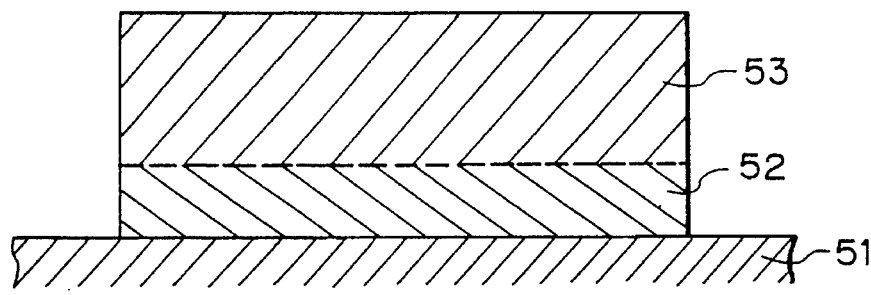
FIG. 10 is an explanatory view of an insulating substrate according to the present invention.

Experiments similar to Example 1 were conducted. Namely, a stainless steel substrate was coated with the insulating thin film of the present invention by the magnetron sputtering process through the use of a target comprising $Al_2O_3$, $SiO_2$ or $HfO_2$ and an argon gas as an atmosphere gas at an argon gas pressure of $5\times10^{-3}$ Torr. SUS430BA was used as a substrate 51, and a 0.02 μm-thick film was first formed as a first layer 52 with the substrate provided at a position where the bombardment of a plasma was small. Thereafter, a 0.48 μm-thick film of the same kind as described above was formed as a second layer 53 under a plasma environment (see FIG. 10). Further, a film having an area of 20 mm² was formed as an upper electrode by magnetron sputtering of aluminum.

Figure 11:
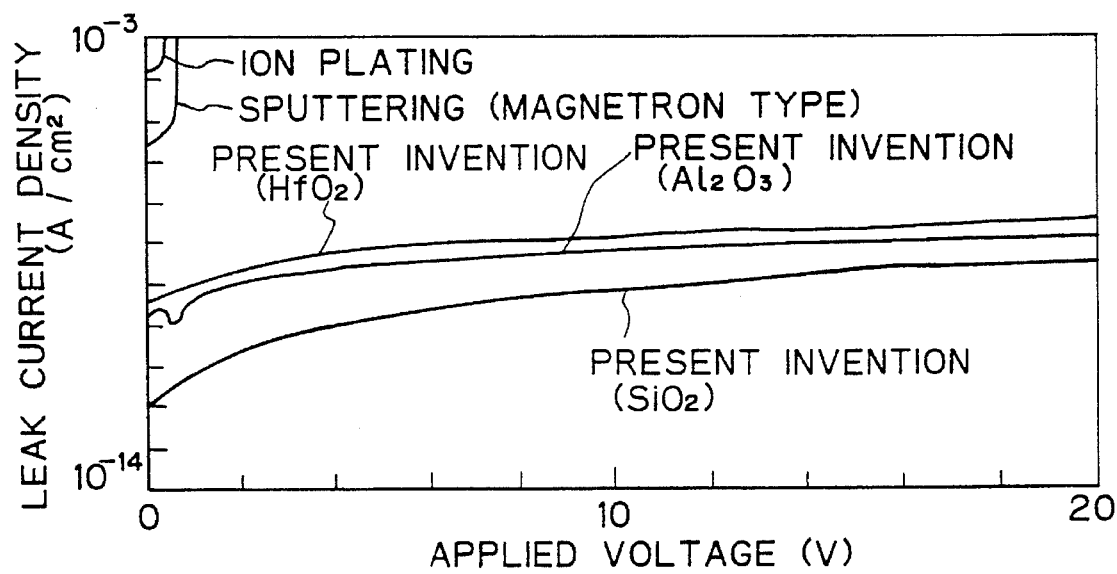
FIG. 11 is a graph showing a voltage-leak current density curve of the sample according to the present invention.

The leak current density in the case where a voltage up to 20 V was applied across the substrate and each electrode of the sample thus prepared is shown in FIG. 11. As apparent from FIG. 11, the insulating thin film of the present invention having a double layer structure comprising two films of the same kind is less susceptible to defects and has a superior insulating property compared with the case whereby a 0.5 μm-thick insulating thin film was formed by the ion plating process or the conventional magnetron sputtering process.

With respect to the materials of the present invention and the conventional materials, the leak current density and the dielectric breakdown voltage of the metallic substrates respectively coated with 0.5 μm-thick thin films of $Al_2O_3$, $SiO_2$ and $HfO_2$ as determined under conditions of an electrode area of 20 mm² and an applied voltage of 20 V are given in Table 2. The results clearly indicate that the materials of the present invention have a superior insulating property to that the conventional materials.

TABLE 2

| | Insulating material | Leak current density (A/cm²) | Dielectric breakdown voltage (V) |
|---|---|---|---|
| Present invention | $Al_2O_3$ | $<10^{-8}$ | >100 |
| | $SiO_2$ | $<10^{-8}$ | >100 |
| | $HfO_2$ | $<10^{-8}$ | >100 |
| Conventional material | $Al_2O_3$ | Dielectric breakdown occurred at 1 V. | |
| | $SiO_2$ | | |
| | $HfO_2$ | | |

We claim:

1. A metallic substrate coated with an insulating material, which comprises a metallic substrate having thereon an insulating thin film, said film comprising an oxide of at least one member selected from the group consisting of Ta, Al, Si, Ti, Ba, Sr, Zr, Y and Hf, said insulating thin film having a thickness of 500 nm or more and a current of $10^{-8}$ A/cm² or less as measured by applying 20 V at an area of 20 mm² and a thickness of 500 nm.

2. A metallic substrate coated with an insulating material according to claim 1 wherein said insulating thin film is a double layer film.

3. A metallic substrate coated with an insulating material according to claim 2 wherein each layer of said double layer film is formed from the same oxide.

4. A metallic substrate coated with insulating material as recited in claim 1 wherein said insulating thin film has a maximum thickness of 1 μm.

\* \* \* \* \*